United States Patent [19]

Landman et al.

[11] Patent Number: 4,959,898

[45] Date of Patent: Oct. 2, 1990

[54] SURFACE MOUNT MACHINE WITH LEAD COPLANARITY VERIFIER

[75] Inventors: Marc M. Landman, Burlington, Mass.; Steven M. Whitman, Danville, N.H.; Robert J. Duncan, Magnolia, Mass.

[73] Assignee: Emhart Industries, Inc., Towson, Md.

[21] Appl. No.: 527,079

[22] Filed: May 22, 1990

[51] Int. Cl.$^5$ .............................................. H05K 3/30
[52] U.S. Cl. ........................................ 29/705; 29/710; 29/714; 29/720; 29/741; 29/833
[58] Field of Search ................. 29/705, 710, 714, 720, 29/721, 741, 833; 350/523–528

[56] References Cited

U.S. PATENT DOCUMENTS 4,742,947  5/1988  Coffman et al. ................. 29/833 X
4,813,588  3/1989  Srivastava et al. ............... 29/833 X Primary Examiner—Carl E. Hall
Attorney, Agent, or Firm—Spencer T. Smith

[57] ABSTRACT

Apparatus for performing a non-contact three-dimensional inspection of a surface-mount component prior to placement on a printed circuit board. Specifically, an arrangement to ensure acceptable alignment (i.e. coplanarity) of all component heads in the XZ or YZ plane, where XY is the plane of the component. The apparatus is embodied within a conventional pick and place machine and performs critical, in-process, lead coplanarity inspection.

4 Claims, 3 Drawing Sheets

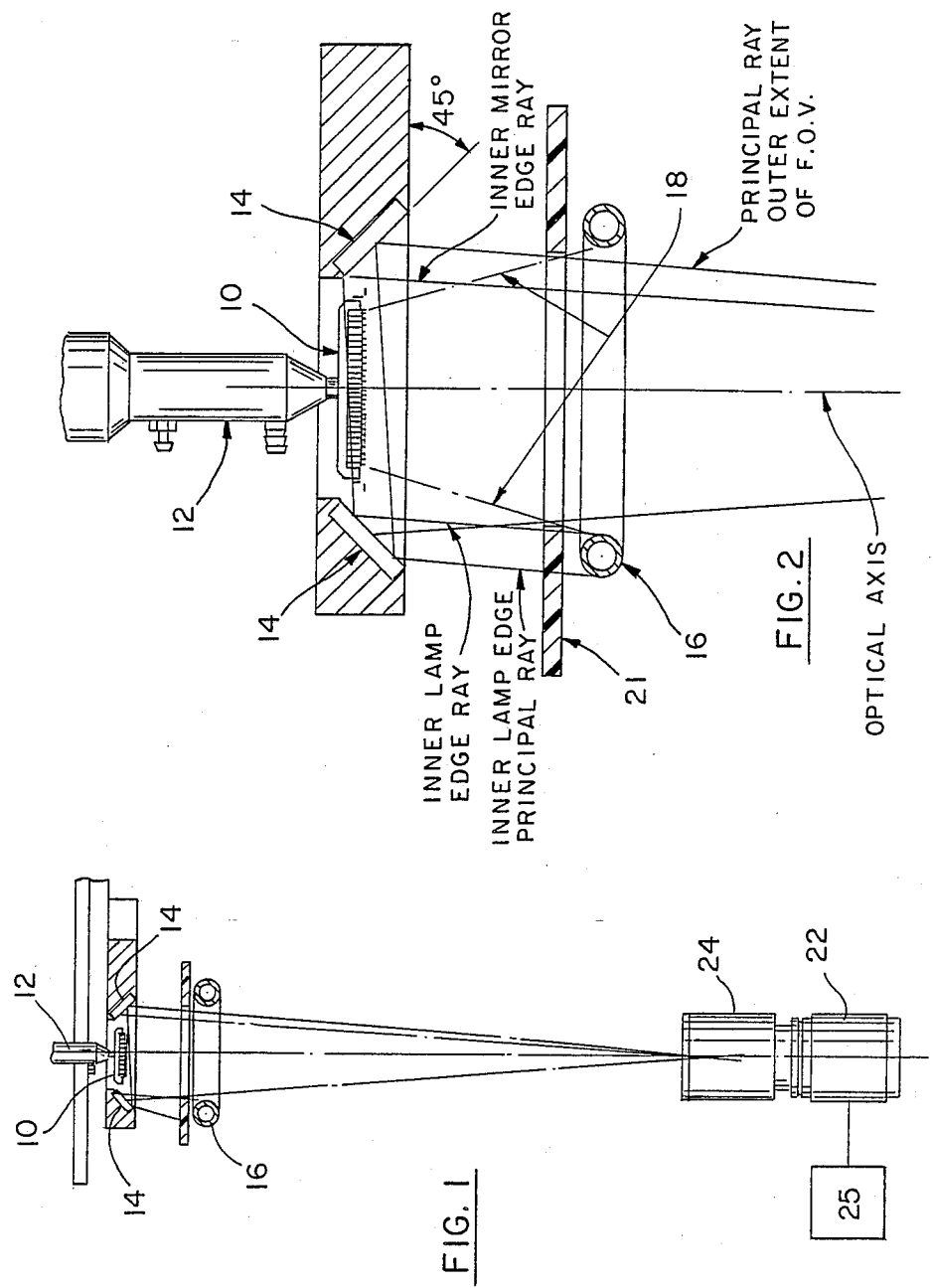

SURFACE MOUNT MACHINE WITH LEAD COPLANARITY VERIFIER

SPECIFICATION

The present invention relates to machines for placing surface mount electronic components on printed circuit boards.

BACKGROUND OF THE INVENTION

It is well known within the electronics industry that lead coplanarity is essential to the successful placement of fine-pitch surface mount devices (SMD's). Non-coplanar leads, i.e. those bent up or down with respect to the body of the component, typically result in opens or poor solder joints on the printed circuit board (PCB). It is desirable to reject any components that do not meet coplanarity requirements prior to placement on the printed circuit board. The present industry standards require that all lead tips be coplanar within a 0.004 inch band, forcing inspection equipment to measure coplanarity with ±0.002 inch accuracy. Although some non-contact 3-D inspection techniques are capable of providing this degree of accuracy, a number of system constraints prohibit their implementation for this application. These constraints include but are not limited to:

(1) large part sizes,
(2) establishment of a reference (datum) plane,
(3) mechanical space and packaging limitations within the pick and place machine, and
(4) real-time inspection to maintain high pick and place throughput rates.

Other techniques, particularly "implied" techniques based around passive triangulation (i.e. estimation of lead height via measured lead length), have severely limited depth resolution. They may also have other drawbacks such as confusion between lead length error and vertical lead displacement as well as ambiguous polarity information (the inability to differentiate between leads bent up or down with respect to the plane of the part).

It is accordingly an object of the present invention to overcome these constraints while providing the necessary degree of accuracy for proper inspection of lead coplanarity. The optical setup inherent in the disclosed system provides a true, direct measurement of lead height. It produces sufficient depth resolution to measure lead coplanarity to an accuracy of ±0.002 inch using conventional sensors and image processing hardware.

An advantage of the disclosed system is its ability to handle a range of SMD components including PQFP, SOIC, PLCC, SOJ, and TapePak with pitch values down to 15 mils. It will accommodate 25-mil pitch parts up to 1.25 inches square in a single field of view. Parts with a larger number of leads or finer leads can also be inspected by breaking up the image into multiple fields of view, typically two or four. If necessary, large fine-pitch devices may be inspected through the use of high resolution image sensors such as line scan or non-RS-170 area cameras, though at present this requires additional complexity for image acquisition.

Other objects and advantages of the present invention will become apparent from the following portion of the specification and from the following drawings which illustrate in accordance with the mandate of the patent statutes a presently preferred embodiment incorporating the principles of the invention.

Referring to the drawings:

FIG. 1 is an side view of a camera based coplanarity inspection station of a machine for placing electronic surface mount components on a printed circuit board made in accordance with the teachings of the present invention;

FIG. 2 is an enlarged view of a portion of FIG. 1;

DESCRIPTION OF THE PREFERRED EMBODIMENT

Figure 3:
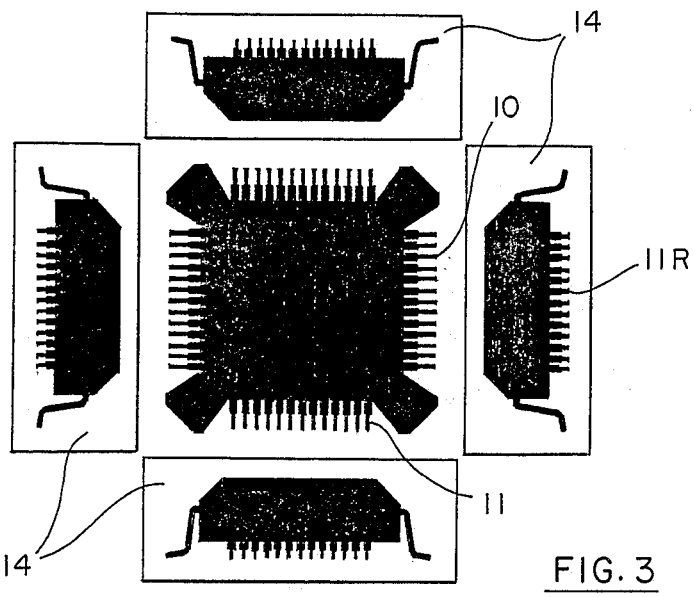
FIG. 3 is the view the camera sees in FIG. 1.

The present invention is schematically illustrated in FIGS. 1 and 2. An SMD electronic component 10 is held by vacuum pressure on a Z-axis manipulator or tool tip 12. The servo-driven tool tip lowers the component to a specific plane inside an arrangement of four identical front-surface mirrors 14. The mirrors 14 are arranged in a square pattern and are angled at approximately a 45 degree angle with respect to the XY plane (i.e. the plane of the part 10).

A single light source 16 located near the plane of the mirror assembly 14 and having straight portions extending parallel to an associated minor portion provides the illumination required for inspection of both the bottom surface of the component (top view) and the component lead rows (side views). The source 16 is of a square-shaped cold cathode lamp which produces intense, uniform front illumination 18 on lead rows extending transverse to the light portion. The front lighting 18 is used to directly illuminate the central portion of the field of view for the 2-dimensional inspection phase, which determines the coordinates of the leads 11 in the XY plane. A backlighting illumination scheme is utilized to view the images 11R of the lead tips reflected from the mirrors 14. Backlighting 20 is achieved with the same light source by passing the intense light through a diffusion plate 21 and imaging the diffused lamp tube 16 on the mirrors 14, thereby silhouetting the images of the lead tips against a uniformly light background. Thus, the composite image to be analyzed contains a front-lit region in the central portion of the field of view and four backlit regions defined by the locations of the mirrors 14 in the periphery of the field of view.

The mirror 14 opposite each lead row reflects a side image of the ends of those leads towards a high resolution CCD video camera and this image is focused onto the sensor of the camera 22 by a lens 24. Simultaneously, the top view of the SMD is imaged directly within the central portion of the field of view of the camera by the lens 24. A second lens can be used to provide a higher magnification image of the component should this be necessary. It is interchangeable with the first lens via a software-controlled solenoid. The primary lens is of the telecentric type to improve the projection of depth images and decrease any measurement error due to slightly defocussed conditions.

The resulting analog video image is digitized to high resolution and stored in a dual-ported frame buffer. The calibration and coplanarity inspection procedures are carried out by a special purpose computer 25 designed for image processing and vision analysis. This system utilizes high-speed vision algorithms such as normalized grey-scale correlation, edge detection, and connectivity analysis for recognition, inspection, alignment, and measurement of various image features.

Figure 4:
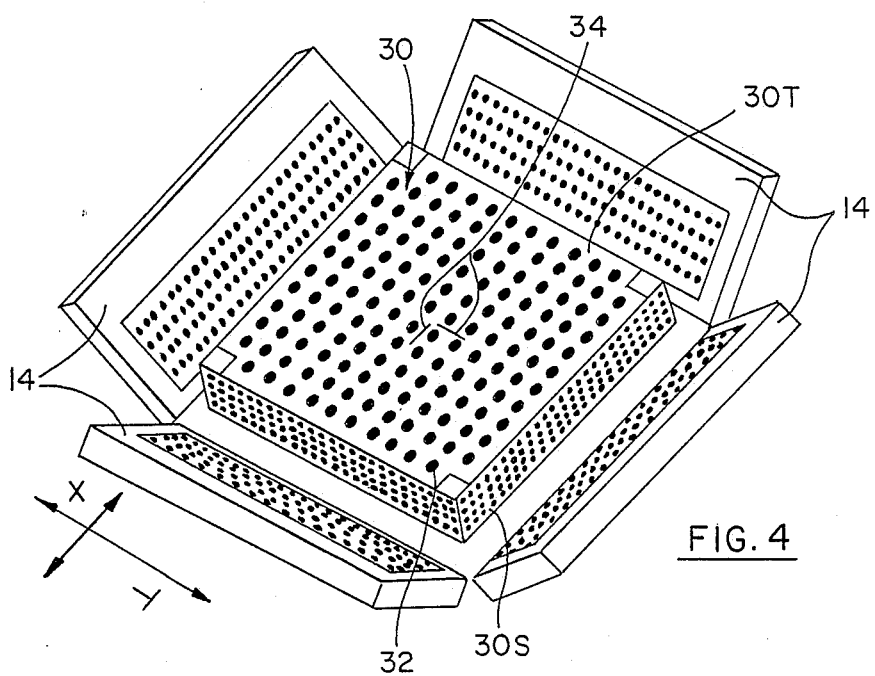
FIG. 4 is an oblique view of a calibration/mapping block supported at the inspection station.

FIG. 3 illustrates how a part 10 appears to the camera. The camera sees both a top view of the component leads 11 and a reflected end view of the lead tips 11R. A 2-D inspection can accordingly be performed to determine the actual locations of the ends of the leads. By imaging a component in this manner, it is also possible to simultaneously perform a 3-D inspection on a single captured video image. In order to accomplish this, a 3-D calibration procedure is utilized to map from the world (x,y,z) coordinate space to the image (x,y) coordinate space. This procedure relates all four side views of the part produced by the four mirrors so they can be mapped into contiguous physical Z planes. Referring to FIG. 4 a calibration/mapping block 30 is shown which is held by the tool tip 12 at a precisely square and centered location. The top horizontal surface 30T of the mapping block contains a grid of precisely positioned locating marks 32 which are equally spaced in the X and Y directions. The mapping block also has X and Y origin markers 34 to facilitate the precise alignment of the mapping block 30. By comparing the top surface image of the calibration/mapping cube to its known physical description, a 3-D to 2-D world to image space mapping is achieved for the XY plane. The four vertical surfaces 30S of the mapping block 30 also contain a grid of precisely placed locating marks 36 which are more closely spaced. In a similar fashion, by comparing the four side images of the calibration/mapping cube to their known physical descriptions, a 3-D to 2-D world to image space mapping is achieved for the XZ and YZ planes.

Figure 5:
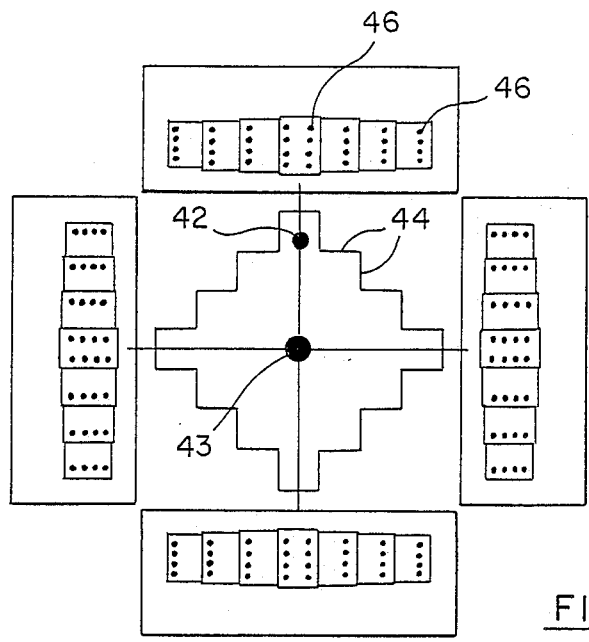
FIG. 5 is a view of a calibration/magnification block supported at the inspection station.

A calibration/magnification block 40 is illustrated in FIG. 5 held by the tool tip at the lead location. FIG. 5 is looking vertically downward at the calibration block. A pair of location marks 42, 43 are used to precisely locate this block. The block is checked for proper alignment in X, Y, and theta. Facing each mirror 14 is a multi-stepped surface. All stepped surfaces 44 are identical and all surfaces facing an associated mirror lie in parallel vertical planes. Eight vertical rows of four location marks 46 having a precise and identical spacing are established on the outer, middle two and inner steps. As can be seen from FIG. 5, the apparent size of these surfaces (and hence the spacing between the dots in the Z direction) as they appear at the mirror will decrease as the distance from the mirror increases. This is due to magnification effects which will make a constant vertical distance (i.e. Z deviation) appear shorter as you proceed farther away from the mirror. This means that a given Z deviation for a given lead will appear smaller as a direct function of distance from the mirror. Since the separation of the marks is precisely known and the distance of the calibration block surfaces from the mirrors can be precisely determined, a correction factor can be calculated to transform a given raw Z position into an absolute world Z coordinate.

The calibration algorithm accounts for the effects of part misalignment such as rotation, XY translation, tilt/skew, as well as optical distortion and magnification effects inherent in the images as seen through the four mirrors. Optical distortion, present in all vision systems, results from non-square pixel distortion and non-linear optical distortion and lens aberrations. Magnification effects are linear and predictable over the range of object space. Once the calibration procedure has been performed, any image points located within any mirror view can be accurately mapped back to their true (x,y,z) coordinates in physical space.

Figure 6:
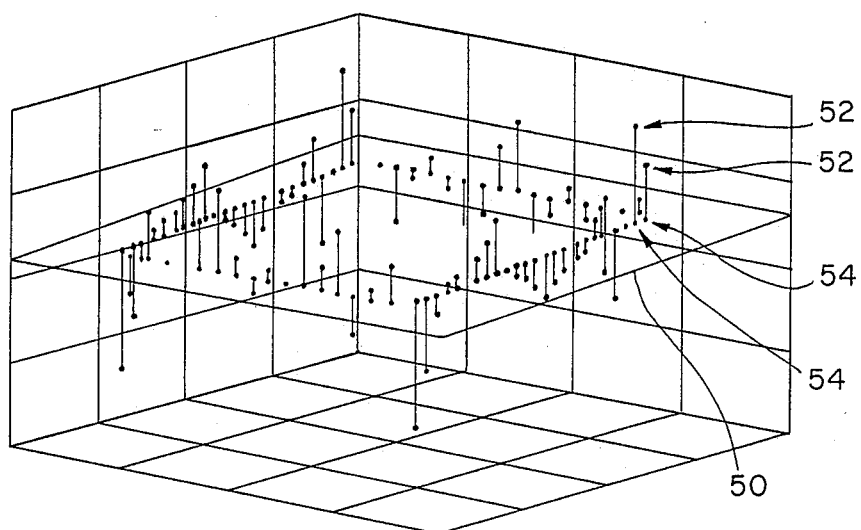
FIG. 6 is a three dimensional representation of the coplanarity evaluation made by the disclosed system.

The definition of coplanarity implies the measurement of lead deviations with respect to a particular reference (datum) plane. This plane could be determined by the three lowest non-colinear points which can form a triangle enclosing the center of mass (the mechanical seating plane), or it could be described by the least-squares best fit plane of all points in (x,y,z) space (the mathematical reference plane). Because of the machine constraints in implementing a mechanical reference plane, as well as the fact that the leads are resting in a volume of solder paste and may be bent up somewhat due to placement force, a mathematical reference plane is the preferred choice for a datum plane. After obtaining the corrected (x,y,z) coordinates of all lead tips, the inspection algorithm performs a regression plane analysis to determine the equation of the mathematical reference plane. Once the ideal (coplanar) plane 50 (FIG. 6) is determined, the uncorrected measured tip deviations are transformed into corrected deviations which are normal to the reference plane. The corrected tip deviations 52 are then compared, lead by lead, with the user-determined coplanarity tolerance value (typically, 0.002 to 0.006 inch from the reference location 54 on the reference plane 50). Leads whose coplanarity deviation fall outside the acceptable tolerance value are marked for rejection and any parts containing such leads are prevented from being placed onto the PCB. FIG. 6 shows such an evaluation.

The calibration and inspection algorithms are fully capable of inspecting large components that require multiple field of view analysis. This is accomplished by creating an object plane which is in essence a large, virtual frame buffer of an optically perfect system. The object space is a remapping of the physical coordinate system which is corrected for all of the systematic effects mentioned above.

We claim:

1. A machine for placing surface mount electronic components having a plurality of rows of horizontally extending leads with the tips of the leads lying in a single plane and the tips of the leads in any row lying along a straight line, the machine comprising;

mirror means, means for locating a surface mount electronic component at a selected position relative to said mirror means, means for illuminating a composite image of the located component composed of a top view in the central portion of the field of view with four side views along the peripheral portion of the field of view such that an image is obtained of both the bottom surface of the component as well as the row of lead tips as viewed reflected from said mirror means, camera means looking at said mirror means to see said reflected lead tips to define the Z location for each lead tip, means for calibrating said system such that a precise coordinate mapping is obtained between the composite 3-D (X,Y,Z) object space comprised of the four side views reflected from said mirror means and the one direct top view to the 2-D (X,Y) image space, means for correcting the defined Z location for each lead tip to compensate for optical effects, means for determining the best reference plane for said lead tips, means for calculating the actual Z deviation for each lead tip from the best reference plane, and means for rejecting the component if the Z deviation for at least one lead tip exceeds a maximum allowable deviation.

2. A machine for placing surface mount electronic components according to claim 1, wherein said illuminating means comprises a single light source for frontlighting said top view of the electronic component and backlighting said side views to define a high contrast image.

3. A machine for placing surface mount electronic components according to claim 2 wherein said mirror means comprises four ninety degree related mirrors which are inclined about 45° to the reference plane.

4. A machine for placing surface mount electronic components according to claim 3 wherein said illuminating means further comprises a diffusion plate intermediate to said single light source means and said mirror means.

* * * * *